(12) United States Patent
Oh et al.

(10) Patent No.: US 11,415,889 B2
(45) Date of Patent: Aug. 16, 2022

(54) CHEMICAL SUPPLY STRUCTURE AND A DEVELOPING APPARATUS HAVING THE SAME

(71) Applicant: SAMSUNG ELECTRONICS CO., LTD., Suwon-si (KR)

(72) Inventors: Jong-Keun Oh, Seoul (KR); Kyoung-Noh Kim, Hwaseong-si (KR); Man-Kyu Kang, Suwon-si (KR); Byung-Gook Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 606 days.

(21) Appl. No.: 16/445,969

(22) Filed: Jun. 19, 2019

(65) Prior Publication Data

US 2020/0150539 A1     May 14, 2020

(30) Foreign Application Priority Data

Nov. 8, 2018    (KR) .................. 10-2018-0136286

(51) Int. Cl.
| | |
|---|---|
| G03G 15/10 | (2006.01) |
| G03F 7/30 | (2006.01) |
| B05B 1/00 | (2006.01) |
| B05C 5/00 | (2006.01) |
| H01L 21/67 | (2006.01) |
| B41J 2/16 | (2006.01) |

(Continued)

(52) U.S. Cl.
CPC .............. *G03F 7/2043* (2013.01); *B05B 1/28* (2013.01); *B05C 5/02* (2013.01); *B05C 11/10* (2013.01); *B41J 2/1606* (2013.01); *G03F 7/0035* (2013.01); *G03F 7/20* (2013.01); *G03F 7/3021* (2013.01); *G03F 7/32* (2013.01); *G03G 15/10* (2013.01); *H01L 21/6708* (2013.01); *H01L 21/67051* (2013.01); *H01L 21/68764* (2013.01)

(58) Field of Classification Search
CPC .. G03G 15/10; G03G 21/00; H01L 21/67051; H01L 21/6708; H01L 21/6715; B05B 1/28; B05C 5/02; B05C 11/10; G03F 7/0035; G03F 7/063; G03F 7/20; G03F 7/2043; G03F 7/30; G03F 7/3021; G03F 7/32; G03F 7/70925; B41J 2/1433; B41J 2/1606; B41J 2/162; B41J 2/1631; B41J 2/1643
See application file for complete search history.

(56) References Cited

U.S. PATENT DOCUMENTS

| | | |
|---|---|---|
| 6,602,382 B1 | 8/2003 | Matsuyama et al. |
| 7,922,405 B2 | 4/2011 | Mitsuhashi et al. |

(Continued)

*Primary Examiner* — Sophia S Chen
(74) *Attorney, Agent, or Firm* — Lee IP Law, P.C.

(57) ABSTRACT

A chemical supply structure includes a bar-shaped body having a plurality of chemical reservoirs in which a plurality of chemicals is individually stored such that the body partially crosses an underlying substrate, a bar-shaped nozzle protruded from a bottom surface of the body and injecting injection chemicals onto the substrate, a plurality of the chemicals being mixed into the injection chemicals, and a hydrophobic unit arranged on the bottom surface of the body and on a side surface of the nozzle such that a mixed solution mixed with the injection chemicals is prevented from adhering to the bottom surface and the side surface by controlling a contact angle of the mixed solution with respect to the bottom surface and the side surface.

20 Claims, 5 Drawing Sheets

(51) Int. Cl.
*G03F 7/20* (2006.01)
*G03F 7/00* (2006.01)
*G03F 7/32* (2006.01)
*B05B 1/28* (2006.01)
*B05C 5/02* (2006.01)
*B05C 11/10* (2006.01)
*H01L 21/687* (2006.01)

(56) References Cited

U.S. PATENT DOCUMENTS

| | | | |
|---|---|---|---|
| 7,926,177 B2 | 4/2011 | Kang et al. | |
| 9,620,393 B2 | 4/2017 | Hashimoto et al. | |
| 9,835,948 B2 | 12/2017 | Muta et al. | |
| 2005/0243129 A1 | 11/2005 | Kim | |
| 2009/0130614 A1* | 5/2009 | Ookouchi | H01L 21/6715 399/246 |
| 2009/0189952 A1 | 7/2009 | Lee et al. | |
| 2015/0255271 A1* | 9/2015 | Muramatsu | H01L 21/6715 156/345.1 |
| 2017/0278710 A1* | 9/2017 | Moon | H01L 21/0274 |
| 2018/0164736 A1 | 6/2018 | Sugiyama et al. | |

* cited by examiner

CHEMICAL SUPPLY STRUCTURE AND A DEVELOPING APPARATUS HAVING THE SAME

CROSS-REFERENCE TO RELATED APPLICATION

Korean Patent Application No. 10-2018-0136286, filed on Nov. 8, 2018, in the Korean Intellectual Property Office, and entitled: "Chemical Supply Structure and a Developing Apparatus Having the Same," is incorporated by reference herein in its entirety.

BACKGROUND

1. Field

Example embodiments relate to a chemical supply structure and a developing apparatus having the same, and more particularly, to a chemical supply structure having a super hydrophobic surface and a developing apparatus having the same.

2. Description of the Related Art

Semiconductor devices and flat panel display devices have been manufactured by a series of unit processes such as a photolithography process, a deposition process, an etching process, an ashing process and a cleaning process. For example, the photolithography process may include a coating process for forming a photoresist layer on a substrate, an exposing process for partially exposing the photoresist layer according to a reticle pattern and a developing process for developing the exposed photoresist layer to thereby form a photoresist pattern on the substrate.

SUMMARY

Embodiments are directed to a chemical supply structure, including a body having a bar-shape, the body having a plurality of chemical reservoirs in which a plurality of chemicals is individually stored such that the body partially crosses an underlying substrate, a nozzle having a bar-shape, the nozzle protruding from a bottom surface of the body and injecting injection chemicals onto the substrate, a plurality of the chemicals being mixed to form the injection chemicals, and a hydrophobic unit arranged on the bottom surface of the body and on a side surface of the nozzle such that a mixed solution that includes the injection chemicals is prevented from adhering to the bottom surface of the body and the side surface of the nozzle by controlling a contact angle of the mixed solution with respect to the bottom surface of the body and the side surface of the nozzle.

Embodiments are also directed to a developing apparatus for a substrate having an exposed photoresist layer thereon, the exposed photoresist layer being partially exposed to light according to a reticle pattern, the developing apparatus including a spin chuck structure that rotates with respect to a rotating axis of the substrate, a first chemical supply structure that supplies one of rinse solution and a pre wetting solution onto the substrate, and a second chemical supply structure that supplies a developing solution onto the substrate such that the photoresist layer is partially dissolved into the developing solution, thereby forming a mixed solution in which photoresist materials are dissolved in the developing solution. The second chemical supply structure may include a body having a bar-shape, the body partially crossing the substrate and having a plurality of chemical reservoirs in which a plurality of chemicals is individually stored, a plurality of the chemicals being mixed to form the developing solution, a nozzle having a bar-shape, the nozzle protruding from a bottom surface of the body and injecting the developing solution onto the substrate, and a hydrophobic unit arranged on the bottom surface of the body and on a side surface of the nozzle such that the mixed solution is prevented from adhering to the bottom surface of the body and the side surface of the nozzle by controlling a contact angle of the mixed solution with respect to the bottom surface of the body and the side surface of the nozzle.

BRIEF DESCRIPTION OF THE DRAWINGS

Features will become apparent to those of skill in the art by describing in detail example embodiments with reference to the attached drawings in which.

DETAILED DESCRIPTION

Figure 1:
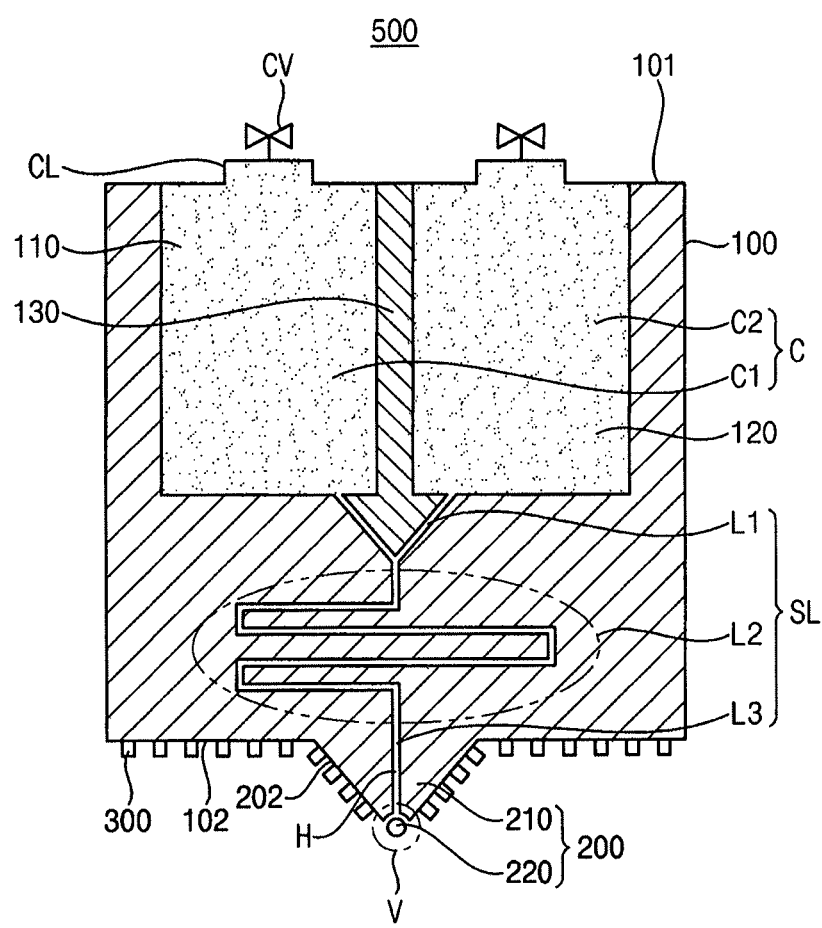
FIG. 1 illustrates a cross sectional view of a chemical supply structure in accordance with an example embodiment.
Figure 1:
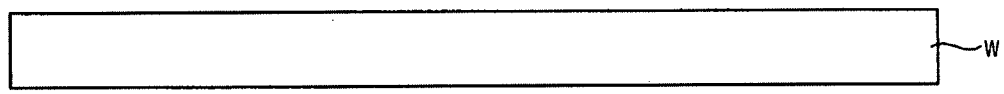
Figure 2:
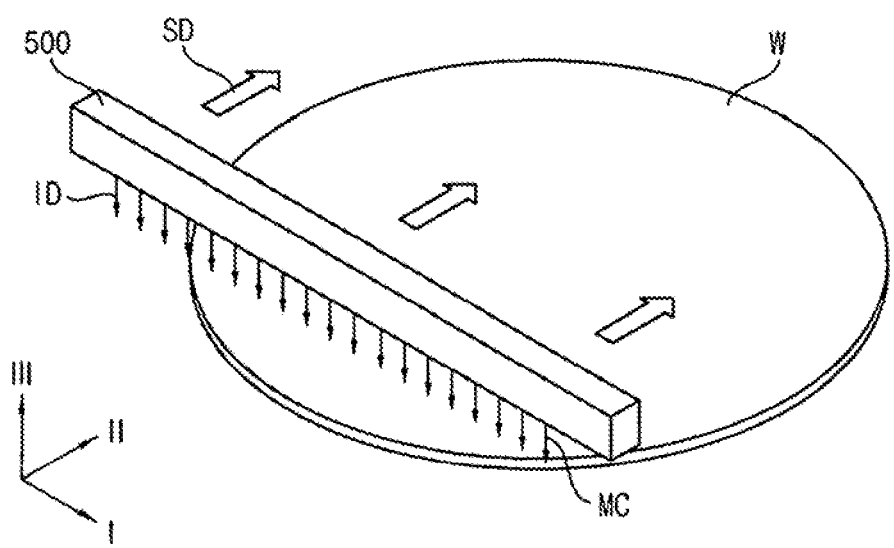
FIG. 2 illustrates a view of a chemical injection of the chemical supply structure shown in FIG. 1.

FIG. 1 is a cross sectional view illustrating a chemical supply structure in accordance with an example embodiment. FIG. 2 is a view illustrating a chemical injection of the chemical supply structure shown in FIG. 1.

Referring to FIGS. 1 and 2, a chemical supply structure 500 in accordance with an example embodiment may include a bar-shaped body 100 that may partially cross an underlying substrate W and having a plurality of chemical reservoirs 110 and 120 in which a plurality of chemicals C is individually stored, a bar-shaped nozzle 200 protruded from a bottom surface 102 of the body 100 and injecting injection chemicals MC onto the substrate W such that a plurality of the chemicals C may be mixed into the injection chemicals MC, and a hydrophobic unit 300 arranged on the bottom surface 102 of the body 100 and on a side surface 202 of the nozzle 200 such that a mixed solution mixed with the injection chemicals MC may be prevented from adhering to the bottom surface 102 and the side surface 202 by controlling a contact angle of the mixed solution with respect to the bottom surface 102 and the side surface 202.

For example, the body 100 may be shaped into a 3-dimensional line having a predetermined volume between a top surface 101 and the bottom surface 102. The chemicals C may be stored in the body 100 and a plurality of supply lines SL may be provided with the body 100. In the present example embodiment, the body 100 may be shaped into a slender bar.

The slender bar may extend in a first direction I, may partially cross the substrate W, and may move in a second direction II substantially perpendicular to the first direction I. Thus, the substrate W may be scanned by the bar-shaped body 100 in the second direction II. The first direction I may be referred to as an extension direction of the chemical supply structure 500 and the second direction II may be referred to as a scan direction SD of the chemical supply structure 500 hereinafter.

The injection chemicals MC may be injected onto the substrate W from the chemical supply structure 500 in a third direction III perpendicular to the first and the second directions I and II while the chemical supply structure 500 may move along the second direction II over the substrate W. The third direction III may be referred to as injection direction ID of the chemical supply structure 500 hereinafter. The extension direction ED, the scan direction SD, and the injection direction ID may be varied in accordance with the configurations and structures of the chemical supply structure 500.

The plurality of the chemical reservoirs 110 and 120 may be provided in the body 100. For example, a first chemical reservoir 110 and a second chemical reservoir 120 may be individually provided in the body 100, and a first chemical C1 and a second chemical C2 may be individually stored in the first and the second chemical reservoirs 110 and 120, respectively. In the present example embodiment, the injection chemicals MC may be provided as a mixture of the first and the second chemicals C1 and C2. However, a single chemical or a chemical mixture having 3 or more chemicals may also be provided as the injection chemical in accordance with the characteristics of a chemical process to the substrate W. Thus, the number and the configurations of the chemical reservoir may be varied according to the number and properties of the chemicals C for the chemical process to the substrate W.

For example, the first and the second chemical reservoirs 110 and 120 may be arranged at an upper portion of the body 100 and may be connected to a plurality of external chemical tanks via a plurality of chemical lines CL. The chemical line CL may penetrate through the top surface 101 of the body 100 and a flow control valve CV may be arranged on each of the chemical lines CL. Thus, the input flux of each chemical C may be controlled by the flow control valve CV.

The first and the second chemical reservoirs 110 and 120 may be separated from each other by a separation wall 130 and may be independent to each other. The separation wall 130 may be selectively provided between the first and the second chemical reservoirs 110 and 120 providing the chemicals C for forming the injection chemicals MC.

In the present example embodiment, the injection chemicals MC may include a developing solution for a developing process to a photoresist layer, and thus the first and the second chemicals C1 and C2 may be selected in view of the developing process to the photoresist layer. For example, the first chemical C1 may include an alkaline solution for selectively dissolving the photoresist layer by a solubility difference between the exposed portion and a non-exposed portion of the photoresist layer. The second chemical C2 may include surfactants or pure water for removing the residuals of the first chemical C1 and the mixture of the photoresist materials and the first chemical C1.

The nozzle 200 may be shaped into a protruding bar extending in the first direction I and protruded from the bottom surface 102 of the body 100 and may be integrally formed with the body 100 in one body. The nozzle 200 may be connected to the first and second chemical reservoirs 110 and 120 via a plurality of supply lines SL. The first and the second chemicals C1 and C2 may be mixed with each other in the supply line SL and the mixture of the first and the second chemicals C1 and C2 may be injected onto the substrate W through the nozzle 200 as the injection chemicals MC.

For example, the nozzle 200 may include a nozzle body 210 having a vertex line V at which a plurality of nozzle holes H may be arranged and the side surface 202 slant with respect to the bottom surface 102 of the body 100 and a plurality of flow controllers 220 arranged under the plurality of the nozzle holes H, respectively, and controlling an injection speed of the injection chemicals MC.

The nozzle body 210 may be shaped into a triangular pyramid bar extending in the first direction I and a plurality of the injection holes H may be arranged at the vertex line V in such a configuration that the injection holes H may be spaced apart by the same gap distance in the first direction I.

For example, the side surface 202 of the nozzle 200 may be slanted at an obtuse angle with respect to the bottom surface 102 of the body 100. Thus, when the chemical supply structure 500 moves linearly ahead over the substrate W along the scan direction SD, the mixed solution, a moving resistance caused by the mixed solution on the substrate W may be sufficiently reduced by the shape of the slant side surface 202 of the nozzle 200. For example, when the photoresist layer is arranged on the substrate W and the injection chemicals MC include a developing solution for developing the photoresist layer, the mixed solution may be provided as an aqueous solution to which the developing chemicals and the photoresist materials may be dissolved.

The nozzle hole H may be connected to the supply lines SL extended from each of the first and the second chemical reservoirs 110 and 120. Thus, the first and the second chemicals C1 and C2 may be firstly mixed with each other in the supply line SL to thereby form a chemical mixture and the chemical mixture may be injected onto the substrate W through the nozzle 200 as the injection chemicals MC.

The supply line SL may include a plurality of discharge line L1 that may be connected to the first and the second chemical reservoirs 110 and 120, respectively, a single mixture line L2 connected with a plurality of the discharge lines L1 and an injection line L3 extended from the mixture line L2 to the injection hole H.

The discharge line L1 may be individually extended from bottoms of the first and the second chemical reservoirs 110 and 120, and thus the first and the second chemicals C1 and C2 may be individually discharged from the first and the second chemical reservoirs 110 and 120 to the mixture line L2.

The first and the second chemicals C1 and C2 may be mixed with each other in the mixture line L2. In the present example embodiment, the mixture line L2 may include a stack line that may be stacked in the third direction III between the discharge lines L1 and the injection line L3. For example, the mixture line L2 may be shaped into a zigzag shape or a helical shape in which a plurality of turning points may be arranged. Thus, the flow direction of the first and the second chemicals C1 and C2 may be changed at every tuning point of the mixture line L2 and the first and the second chemicals C12 and C2 may be uniformly mixed with each other in the mixture line L2. Accordingly, the chemical mixture in the mixture line L2 may be formed into a uniform solution.

The injection line L3 may be vertically extended from the mixture line L2 and may be connected to the nozzle hole H. Thus, the uniform chemical mixture may be injected onto the substrate W through the nozzle hole H as the injection chemicals MC.

The flow controller 220 may be arranged under each nozzle hole H and may change an injection stream of the injection chemicals MC in such a way that the injection speed of the injection chemicals MC may be reduced and the impact to the substrate W caused by the injection chemicals MC may be minimized.

For example, the flow controller 220 may include a flow control ball having substantially the same diameter as the nozzle hole H. Thus, the injection chemicals MC injected from the injection hole H may collide with the flow control ball and the kinetic energy of the injection chemical MC may be reduced. In addition, the stream of the injection chemicals MC may spread along s surface of the fluid control ball and may be changed into a surface stream from a line stream. Accordingly, the damage to the photoresist layer on the substrate W caused by the direct collision with the injection chemicals MC may be reduced or minimized due to the reduction of the kinetic energy and the surface stream of the injection chemicals MC.

While a single flow controller 220 may be arranged under the nozzle hole H, two or more flow controllers may also be arranged under the nozzle hole H in view of the stream configuration and the injection speed of the injection chemicals MC. In addition, the position of the fluid control ball may be varied according to an injection direction of the injection chemicals MC, so that the fluid control ball may be arranged in such a way that the kinetic energy of the injection chemicals MC may be reduced and the fluid control ball may be protected from contamination caused by the mixed solution.

The hydrophobic unit 300 may be arranged on the bottom surface 102 of the body 100 and on the side surface 202 of the nozzle 200 in such a way that the mixed solution may be prevented from adhering to the bottom surface 102 and the side surface 202 by controlling a contact angle of the mixed solution with respect to the bottom surface 102 and the side surface 202.

When the chemical supply structure 500 moves ahead in the scan direction SD over the substrate W, the mixed solution in which the photoresist materials is dissolved together with the injection chemicals MC may be accumulated ahead of the chemical supply structure 500 and a level of the mixed solution may be higher at a front portion of the chemical supply structure 500 than at a rear portion of the chemical supply structure 500. Thus, the bottom surface 102 of the body 100 and the side surface 202 of the nozzle 200 may come into contact with the mixed solution at the front portion of the chemical supply structure 500. If the mixed solution is adsorbed onto the bottom surface 102 and the side surface 202, the water in the mixed solution may be evaporated and thus the photoresist materials may only remain on the bottom surface 102 and the side surface 202 as scan residuals. Thus, the dissolved photoresist materials in the mixed solution may be adhered to the bottom surface 102 and the side surface 202 of the chemical supply structure 500 as scan residuals. The scan residuals of the chemical supply structure 500 may drop onto a next substrate and may function as particle sources when the next developing process may be conducted to the next substrate.

Minimizing adsorption of the mixed solution to the bottom surface 102 and the side surface 202 may significantly reduce the particle sources in the next developing process. The adsorption degree of the mixed solution to the bottom surface 102 and the side surface 202 may be evaluated by a contact angle of the mixed solution with respect to the bottom surface 102 and the side surface 202.

Figure 3:
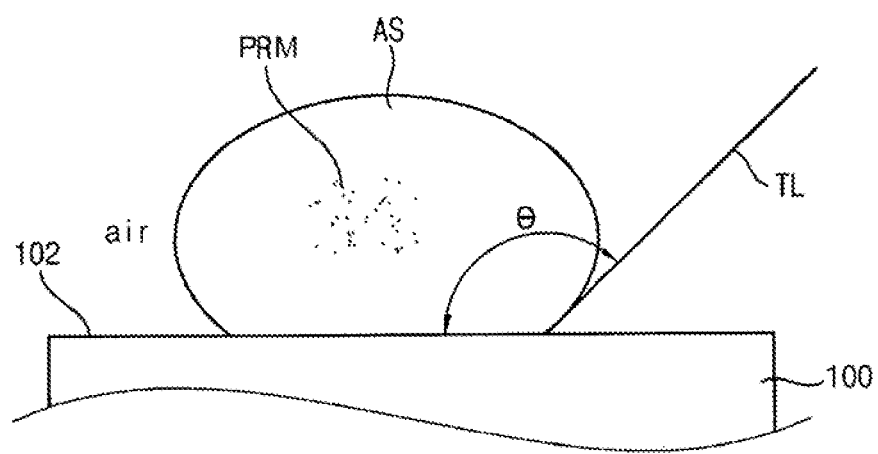
FIG. 3 illustrates a view of a contact angle of the mixed solution with respect to the bottom surface of the body.

FIG. 3 is a view illustrating a contact angle of the mixed solution with respect to the bottom surface of the body.

Referring to FIG. 3, when the mixed solution AS into which the photoresist materials PRM are dissolved is adsorbed onto the bottom surface 102 of the body 100 in air, the contact angle θ may be defined as an angle between a tangential line TL of a droplet of the mixed solution AS and a droplet surface which may be a portion of the bottom surface 102 covered by the droplet. When the contact angle θ of the mixed solution AS is about 0° with respect to the bottom surface 102, no surface tension may be applied to the mixed solution AS and the mixed solution AS may be completely spread along the bottom surface 102 without any droplets of the mixed solution AS. In contrast, when the contact angle θ of the mixed solution AS is more than about 90° with respect to the bottom surface 102, the mixed solution AS may be provided as a liquid droplet separated from the bottom surface 102.

Thus, the greater the contact angle θ of the mixed solution AS with respect to the bottom surface 102, the more of a full droplet the mixed solution may form. As the mixed solution AS may be formed to be more like a droplet, the mixed solution AS may be separated more easily from the bottom surface 102 of the body 100. Accordingly, as the contact angle θ of the mixed solution AS becomes greater, the mixed solution AS may be separated more easily from the bottom surface 102 and may be less spread on the bottom surface 102 of the body 100. The above relations between the contact angle θ of the mixed solution AS and the bottom surface 102 may be substantially the same between the contact angle θ of the mixed solution AS and the side surface 202 of the nozzle 200.

When the photoresist layer is formed on the substrate W, the mixed solution AS may include the photoresist materials PRM and the scan residuals of the photoresist materials PRM may function as contaminants in the next developing process.

The hydrophobic unit 300 may control the contact angle θ of the mixed solution AS in a range of about 150° to about 175° and thus the mixed solution AS may be minimized from being adsorbed onto the bottom surface 102 and the side surface 202. Therefore, the scan residuals of the photoresist materials PRM may be minimized on the bottom surface 102 and the side surface 202.

Figure 4:
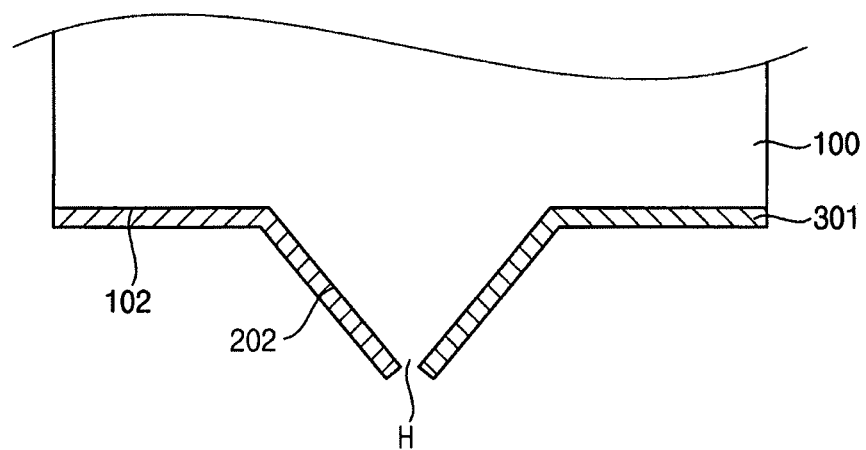
FIG. 4 illustrates a cross sectional view of the hydrophobic unit of the chemical supply structure shown in FIG. 1 in accordance with a first example embodiment.

FIG. 4 is a cross sectional view illustrating the hydrophobic unit of the chemical supply structure shown in FIG. 1 in accordance with a first example embodiment.

Referring to FIG. 4, the hydrophobic unit may include a hydrophobic layer 301 that may be coated on the bottom surface 102 of the body 100 and the side surface 202 of the nozzle 200.

For example, low surface energy materials may be coated on the bottom surface 102 of the body 100 and the side surface 202 of the nozzle 200, thereby forming the hydrophobic layer 301 on the bottom surface 102 and the side surface 202. Since the hydrophobic layer 301 may have relative low surface energy, the spread of the mixed solution may be restricted on the bottom surface 102 and the side surface 202 and thus the mixed solution may be less adsorbed onto the bottom surface 102 and the side surface 202. Therefore, fewer or no scan residuals including the photoresist materials may remain on the bottom surface 102 and the side surface 202.

In the present example embodiment, the hydrophobic layer may include one of a vanadium oxide ($V_2O_5$) layer and a self-assembled monolayer (SAM).

For example, when the body 100 and the nozzle 200 include a composite of lead (Pb), zinc oxide (ZnO), and silicon oxide ($SiO_2$), the contact angle of the vanadium oxide layer may increase to about 170.3°.

In addition, when self-assembled organic molecules are adsorbed onto the bottom surface 102 and the side surface 202, the self-assembled organic molecules may be organized into a single mono layer by itself, thereby forming a monolayer including the mono molecules as the self-assembled monolayer (SAM). The mono molecules of the self-assembled monolayer (SAM) may be bonded to each other by non-covalent bonding forces, so that the molecular bonding of the self-assembled monolayer (SAM) may be in a much stable and equivalent state. Therefore, although the mixed solution may be arranged on the SAM, the chemical reaction or the boundary forces between the SAM and the mixed solution may be sufficiently restricted due to the stable and equivalent state of the SAM. Thus, the spread of the mixed solution may be restricted on the SAM, the mixed solution may be formed into a much more complete droplet on the SAM, and the contact angle of the droplet may be sufficiently large with respect to the bottom surface 102 and the side surface 202.

When the bottom surface 102 and the side surface 202 are fully covered with the hydrophobic layer 301, the mixed solution may be much less adsorbed onto the bottom surface 102 and the side surface 202. Thus, the scan residuals may be minimized on the bottom surface 102 and the side surface 202 when the chemical supply structure 500 scans the substrate W in the scan direction SD and the bottom surface 102 and the side surface 202 become wet with the mixed solution at the front portion of the chemical supply structure 500. Thus, the particle sources caused by the scan residuals may be minimized in the next chemical process.

Figure 5:
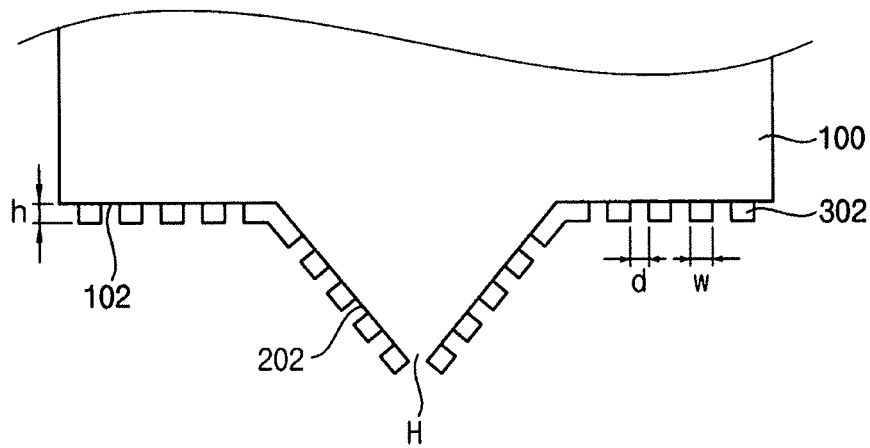
FIG. 5 illustrates a cross sectional view of the hydrophobic unit of the chemical supply structure shown in FIG. 1 in accordance with a second example embodiment.

FIG. 5 is a cross sectional view illustrating the hydrophobic unit of the chemical supply structure shown in FIG. 1 in accordance with a second example embodiment.

Referring to FIG. 5, the hydrophobic unit may include a hydrophobic pattern 302 arranged on the bottom surface 102 of the body 100 and the side surface 202 of the nozzle 200.

For example, an insulation layer may be formed on the bottom surface 102 and the side surface 202, and then may be patterned into the hydrophobic pattern 302 by a patterning process such as a photolithography process.

For example, the hydrophobic pattern 302 may have a width w of about 10 nm to about 30 nm. When the width of the hydrophobic pattern 302 is less than or equal to about 30 nm, the contact angle of the mixed solution may be more than or equal to about 150°. However, when the width of the hydrophobic pattern 302 is less than about 10 nm, the contact angle of the mixed solution may be close to about 180° and the spread characteristics of the mixed solution may be strengthened on the bottom surface 102 and the side surface 202. Thus, the width of the hydrophobic pattern 302 may be in a range of about 10 nm to about 30 nm such that the contact angle of the mixed solution may be in a range of about 150° to about 175°.

For example, the hydrophobic pattern 302 may be formed in a configuration in which a gap distance d may be substantially the same as the width w, and a height h may be about 3 times to about 5 times the width w. Thus, the hydrophobic pattern 302 may have an aspect ratio of about 3 to about 5. The greater the aspect ratio of the hydrophobic pattern 302, the greater the contact angle of the mixed solution for a given width w and gap distance d of the hydrophobic pattern 302. Thus, if the width w and the gap distance d of the hydrophobic pattern 302 are restricted under some circumstances, the contact angle of the mixed solution may still set to be in a range of about 150° to about 175° by changing the aspect ratio of the hydrophobic pattern 302.

Figure 6:
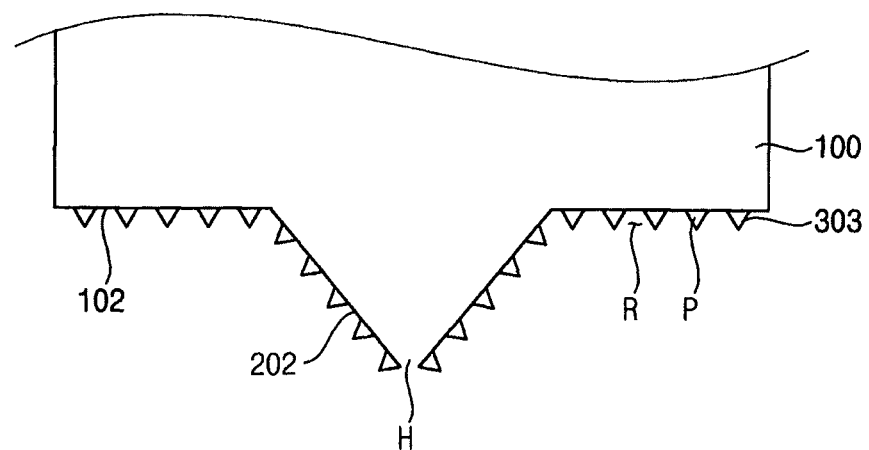
FIG. 6 illustrates a cross sectional view of the hydrophobic unit of the chemical supply structure shown in FIG. 1 in accordance with a third example embodiment.

FIG. 6 is a cross sectional view illustrating the hydrophobic unit of the chemical supply structure shown in FIG. 1 in accordance with a third example embodiment.

Referring to FIG. 6, the hydrophobic unit may include a plurality of protrusions P 303 on the bottom surface 102 of the body 100 and the side surface 202 of the nozzle 200.

For example, a surface treatment such as a sand blast process may be conducted to the bottom surface 102 and the side surface 202 in such a way that a plurality of the protrusions P and recesses R may be arbitrarily arranged on the bottom surface 102 and the side surface 202. A mass of fine sands may be rapidly injected onto the bottom surface 102 and the side surface 202 and thus a random distribution of the protrusions P and recesses R may be provided on the bottom surface 102 and the side surface 202.

Thus, the contact angle of the mixed solution may increase due to the protrusions P of the bottom surface 102 and the side surface 202.

According to the present example embodiment of the chemical supply structure 500, the hydrophobic unit 300 may be arranged on the bottom surface 102 of the body 100 and the side surface 202 of the nozzle 200 in such a configuration that the contact angle of the mixed solution having the photoresist materials may increase. Thus, the mixed solution may be prevented from being adhering to the bottom surface 102 of the body 100 and the side surface 202 of the nozzle 200 and no or fewer scan residuals may remain on the bottom surface 102 and the side surface 202. Accordingly, substrate contaminants caused by particle sources may be significantly reduced in the next chemical process without any additional cleaning process or rinsing process to the bottom surface 102 of the body 100 and the side surface 202 of the nozzle 200.

Figure 7:
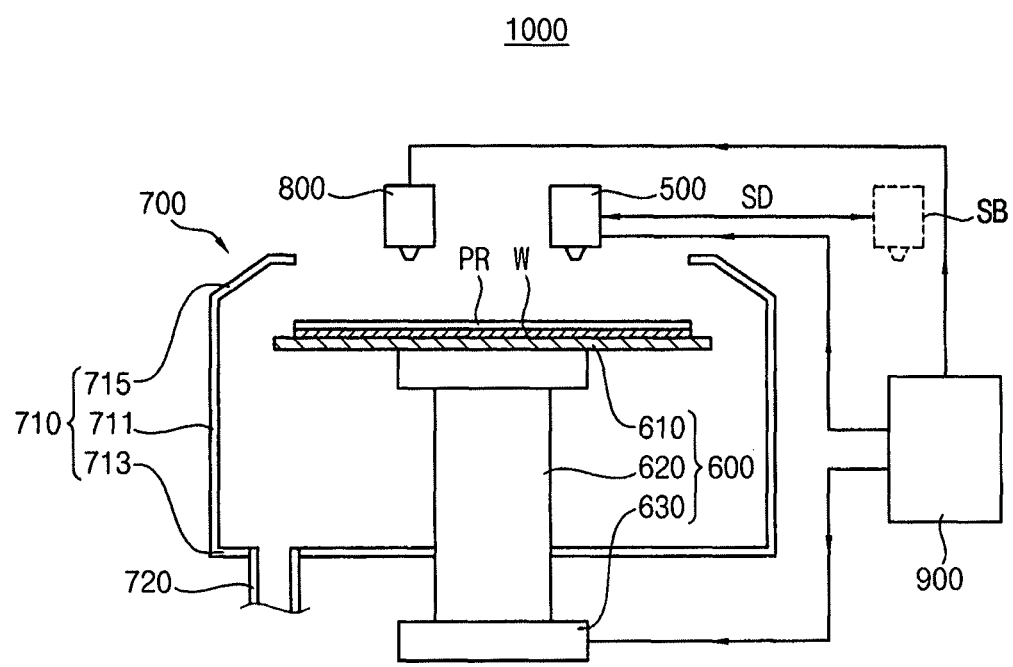
FIG. 7 illustrates a structural view of a developing apparatus including the chemical supply structure shown in FIG. 1 in accordance with an example embodiment.
Figure 8:
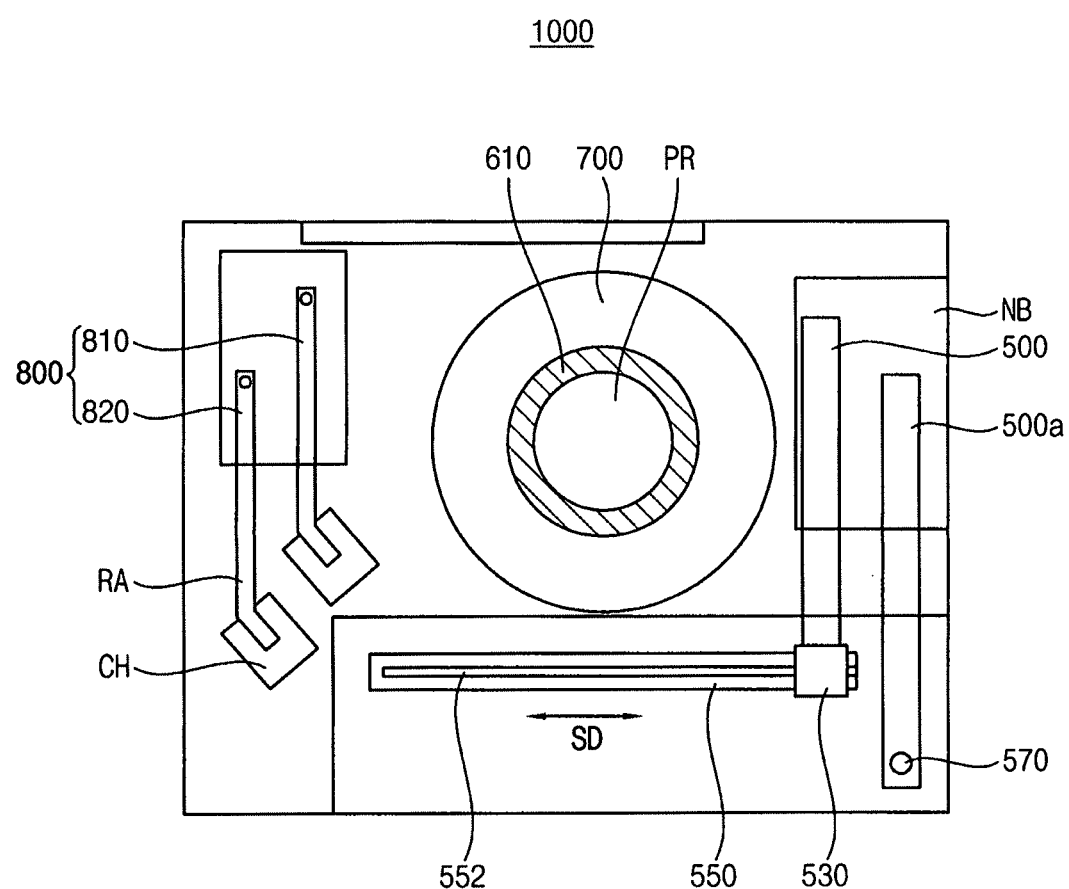
FIG. 8 illustrates a plan view of the developing apparatus shown in FIG. 7.

FIG. 7 is a structural view illustrating a developing apparatus including the chemical supply structure shown in FIG. 1 in accordance with an example embodiment. FIG. 8 is a plan view illustrating the developing apparatus shown in FIG. 7.

Referring to FIGS. 7 and 8, a developing apparatus 1000 in accordance with an example embodiment may develop one of an exposed portion or a non-exposed portion of the photoresist layer PR on a substrate W, thereby forming a photoresist pattern on the substrate W. One of the exposed portion or the non-exposed portion of the photoresist layer PR may be removed from the substrate W according to the material properties of the photoresist layer PR. While the preset example embodiment discloses that the photoresist layer PR may be developed by the developing apparatus 1000, any other photosensitive layer may also be developed by the developing apparatus 1000 as long as the photosensitive layer may be sufficiently removed from the substrate W by an exposure process and a developing process.

For example, the developing apparatus 1000 may include a spin chuck structure 600 to which the substrate W having a photoresist layer PR may be secured and rotating with respect to a central rotating axis 620 thereof, a vessel 700 (developing vessel) in which the photoresist layer PR may be developed, a first chemical supply structure 800 supplying one of rinse solution and a pre wetting solution onto the substrate W, a second chemical supply structure 500 supplying a developing solution onto the substrate W, and an apparatus controller 900 for controlling the spin chuck structure 600, the first chemical supply structure 800, and the second chemical supply structure 500. The photoresist layer PR may be partially exposed to a light according to a reticle pattern in a posterior exposure process to the photoresist layer PR.

For example, the spin chuck structure 600 may be rotated with the central rotating axis 620 and the substrate W on which the photoresist layer PR may be coated may be secured to the spin chuck structure 600. The spin chuck structure 600 may be rotated at a predetermined speed in the developing process to the photoresist layer PR.

The spin chuck structure 600 may include a plate 610 to which the substrate W may be secured, the central rotating axis 620 extending downwards from the plate 610 and a driver 630 for rotating the central rotating axis 620. Thus, the substrate W secured to the plate 610 may be rotated as the plate 610 may be rotated by the driver 630.

A plurality of pin structures may be arranged on the substrate W and the substrate W may be supported by the pin structures. The pin structures may support the rear surface and the side surface of the substrate W for increasing the stability of the combination of the substrate W and the plate 610. The central rotating axis 620 may be assembled to a bottom of the plate 610 and may be shaped into a cylinder extending from the plate 610 downwards. The central rotating axis 620 may be rotated by the driver 630, and thus the plate 610 may also be rotated together with the central rotating axis 620. The rotation speed of the central rotating axis 620 may be controlled by the driver 630 for a proper rotation of the substrate W in the developing process. For example, the driver 630 may include a servo motor.

The vessel 700 may be shaped into a cup enclosing the spin chuck structure 600 and the developing process may be conducted in an inner space of the vessel 700. Thus, the inner space of the vessel 700 may be provided as a process space for the developing process.

For example, the vessel 700 may include a vessel body 710 enclosing the spin chuck structure 600 and a recovery line 720 connected to a bottom of the vessel body 710 and collecting the developing solutions.

The vessel body 710 may include a sidewall 711, a floor 713 and an upper slant wall 715. The sidewall 711 may be shaped into a ring enclosing the spin chuck structure 600 in such a configuration that the central axis of the ring may coincide with the central rotating axis 620 of the spin chuck structure 600. The floor 713 may extend horizontally from a lower portion of the sidewall 711 toward the spin chuck structure 600. The central rotating axis 620 may penetrate through the floor 713 and may reach the plate 610. The upper slant wall 715 may extend slant from an upper portion of the sidewall 711. The upper slant wall 715 may be slanted at an obtuse angle or a right angle with respect to the sidewall 711.

The recovery line 720 may collect the developing solution injected onto the substrate W and any other byproducts of the developing process. The recovery line 720 may penetrate through the floor 713 and may extend to an external recovery tank from the process space of the vessel 700.

In the present example embodiment, the vessel 700 may be stationed at a fixed position and the plate 610 of the spin chuck structure 600 may move upwards and downwards for controlling the gap distance between the floor 713 of the vessel 700 and the spin chuck structure 600. However, a position controller may be further provided with the developing apparatus 1000 for controlling the gap distance between the floor 713 of the vessel 700 and the spin chuck structure 600.

The first chemical supply structure 800 may supply the rinsing solution and/or the pre wetting solution onto the substrate W. For example, the first chemical supply structure 800 may include a wetting nozzle 810 for supplying the pre wetting solution to the substrate W prior to the injection of the developing solution and a rinsing nozzle 820 for rinsing away the photoresist materials dissolved out from the photoresist layer PR by the developing solution.

The first chemical supply structure 800 may include a couple of chemical holders CH for storing the pre wetting solutions and the rinsing solutions, respectively, and a couple of rotation arms RA for rotating the chemical holders CH, respectively. When the rotation arm RA is rotated over the substrate W, the pre wetting solution or the rising solution may be supplied onto the substrate W from the chemical holder CH. The chemical holder CH may be connected to an external solution tank.

For example, the pre wetting solution may be supplied onto the substrate W prior to the developing process and the surface of the substrate W may be changed into the hydrophobic surface form the hydrophilic surface. Thus, the fluidity of the developing solution may be maintained on the substrate W and thus the photoresist layer PR may be dissolved into the developing solution because the developing solution may have hydrophilic properties. For example, the pre wetting solution may include pure water and ionized water.

The rinsing solution may be supplied onto the substrate W after completing the developing process to the substrate W. When the developing process is completed, the photoresist materials dissolved out from the photoresist layer PR may remain on the substrate W in the pre wetting solution and the developing solution. In such a case, the rinsing solution may be supplied onto the substrate W and the dissolved photoresist materials may be removed from the substrate W. The injection specifications of the rinsing solution may be varied according to the rotation speed of the substrate W and the solution characteristics of the developing solution and the pre wetting solution. For example, the rinsing solution may include pure water and ionized water.

The second chemical supply structure 500 may supply the developing solution onto the substrate W and thus the photoresist layer PR may be selectively dissolved into the developing solution. The photoresist layer may be selectively exposed by a light in an exposure process using a reticle and the material properties of the photoresist layer may be changed along the reticle pattern. Then, the exposed portion or the non-exposed portion of the photoresist layer PR may be dissolved into the developing solution, thereby forming a mixed solution in which the photoresist materials may be dissolved with the developing solution and a photoresist pattern corresponding to the reticle pattern.

The second chemical supply structure 500 may be provided at a side of the spin chuck structure 600. The second chemical supply structure 500 may be secured to a transfer guide 550 by a fixing bracket 530. The fixing bracket 530 may be secured to an end portion of the second chemical supply structure 500 and may move linearly along a transfer rail 552 of the transfer guide 550 in the scan direction SD and thus the second chemical supply structure 500 may also linearly move forward or backwards in the scan direction SD. The second chemical supply structure 500 may be shaped into a slender bar extending in an extension direction that is perpendicular to the scan direction SD.

The second chemical supply structure 500 may linearly move over the substrate W and the developing solution may be supplied onto the substrate W when linearly moving across the substrate W. Thus, the substrate W may be linearly scanned by the second chemical supply structure 500 and the developing solution may be supplied onto the substrate W when scanning the substrate W.

The second chemical supply structure 500 may have substantially the same structure as the chemical supply structure described in detail with references to FIGS. 1 to 6. Thus, in the present example embodiment, the same reference numerals denote the same elements in FIGS. 1 to 6. The second chemical supply structure 500 may include a bar-shaped body 100 that may partially cross the substrate and having a plurality of chemical reservoirs 110 and 120 in which a plurality of chemicals C may be individually stored, a bar-shaped nozzle 200 protruded from a bottom surface 102 of the body 100 and injecting a developing solution onto the substrate W, and a hydrophobic unit 300 arranged on the bottom surface 102 of the body 100 and on a side surface 202 of the nozzle 200 such that the mixed solution may be prevented from adhering to the bottom surface 102 and the side surface 202 by controlling a contact angle of the mixed solution with respect to the bottom surface 102 and the side surface 202. The plurality of the chemicals C may be mixed into the developing solution.

Accordingly, when the second chemical supply structure 500 scans the substrate W that is covered by the pre wetting solution, the hydrophobic unit 300 may be arranged on the bottom surface 102 of the body 100 and the side surface 202 of the nozzle 200 in such a configuration that the contact angle of the mixed solution having the photoresist materials R may be increased. Thus, the mixed solution may be prevented from being adhered to the bottom surface 102 of the body 100 and the side surface 202 of the nozzle 200 and no or fewer scan residuals may remain on the bottom surface 102 and the side surface 202. Accordingly, substrate contaminants caused by particle sources may be significantly reduced in the next chemical process without any additional cleaning process or rinsing process to the bottom surface 102 of the body 100 and the side surface 202 of the nozzle 200.

In a modified example embodiment, a supplementary chemical supply structure 500*a* may be further provided with the developing apparatus 1000. The supplementary chemical supply structure 500*a* may also be shaped into a slender bar and may be arranged at a side of the second chemical supply structure 500. The supplementary chemical supply structure 500*a* may have substantially the same structures as the second chemical supply structure 500 and may supply the developing solution onto the substrate W. However, the supplementary chemical supply structure 500*a* may rotate over the substrate W and thus the substrate W may be rotatably scanned by the supplementary chemical supply structure 500*a*. A fixation end of the supplementary chemical supply structure 500*a* may be secured to a pivot point 570 and the supplementary chemical supply structure 500*a* may be rotated with respect to the pivot point 570 across the substrate W.

The second chemical supply structure 500 and the supplementary chemical supply structure 500*a* may move over the substrate W alternately or selectively.

The nozzle 200 of the second chemical supply structure 500 may be positioned at a nozzle bath NB in a standby state. A nozzle cleaning unit may be provided with the nozzle bath NB and the bottom surface 102 of the body 100 and the side surface 202 of the nozzle 200 may be cleaned off by the nozzle cleaning unit. Thus, the scan residuals may be secondarily removed from the bottom surface 102 of the body 100 and the side surface 202 of the nozzle 200, thereby minimizing the substrate contaminants caused by the particle sources in the developing process.

The apparatus controller 900 may control systematically the driver 630, the first chemical supply structure 800 and the second chemical supply structure 500 in such a way that the developing process may be conducted to the photoresist layer PR on the substrate W.

For example, the apparatus controller 900 may control the rotation speed of the substrate W, the scan speed of the second chemical supply structure 500 and the amount of the developing solution in view of the local area to which the developing solution may be supplied. Thus, the scan speed of the second chemical supply structure 500 and the flux of the developing solution may be controlled in such a way that the photoresist layer may be uniformed developed along a whole surface of the substrate W.

By way of summation and review, photoresist materials may be coated on a substrate by a coating process such as a spin coating process, and the photoresist layer formed thereby may be selectively exposed to light using a reticle. The properties of the photoresist material are changed by the light according to the reticle pattern and the reticle pattern is transcribed onto the photoresist layer by the exposing process. Then, the exposed portion or non-exposed portion of the photoresist layer may be removed by a developing process such that the transcribed photoresist pattern remains on the substrate as the photoresist pattern.

In a general developing process, a pre wetting solution such as pure water may be first supplied onto the substrate (to make the surface of the substrate have hydrophilic properties) and then a developing solution is supplied onto the hydrophilic surface of the substrate. Thus, the developing solution is supplied onto the substrate covered by the pre wetting solution by a chemical supply structure.

However, when the chemical supply structure is linearly scanned along the substrate covered by the pre wetting solution, the surface of the pre wetting solution may tend to rise ahead toward a moving direction of the chemical supply structure, and as a result the bottom of the chemical supply structure may make contact with the photoresist materials dissolved in the developing solution. Thus, the dissolved photoresist materials may become adhered to the bottom of the chemical supply structure as scan residuals. The scan residuals on the bottom of the chemical supply structure may drop onto a next substrate when the next developing process is conducted to the next substrate. Thus, the scan residuals may be particle sources while conducting the next developing process on the next substrate. The scan residuals may be periodically removed from the chemical supply structure to prevent the particle sources in the next developing process, but such an approach may not be completely effective to eliminate particle sources.

As described above, the hydrophobic unit may be arranged on the bottom surface of the body and the side surface of the nozzle in such a configuration that the contact angle of the mixed solution having the photoresist materials may sufficiently increase. Thus, the mixed solution may be prevented from being adhering to the bottom surface of the body and the side surface of the nozzle and no or less scan residuals may remain on the bottom surface and the side surface. Accordingly, the substrate contaminants caused by the particle sources may be significantly reduced in the next chemical process without any additional cleaning process or rinsing process to the bottom surface of the body and the side surface of the nozzle. Embodiments may provide a chemical supply structure having a hydrophobic surface and sufficiently minimizing the scan residuals on the surface thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chemical supply structure, comprising:
a body having a bar-shape, the body having a plurality of chemical reservoirs in which a plurality of chemicals is individually stored such that the body partially crosses an underlying substrate;
a nozzle having a bar-shape, the nozzle protruding from a bottom surface of the body and injecting injection chemicals onto the substrate, a plurality of the chemicals being mixed to form the injection chemicals; and
a hydrophobic unit arranged on the bottom surface of the body and on a side surface of the nozzle such that a mixed solution that includes the injection chemicals is prevented from adhering to the bottom surface of the body and the side surface of the nozzle by controlling a contact angle of the mixed solution with respect to the bottom surface of the body and the side surface of the nozzle.

2. The chemical supply structure as claimed in claim 1, wherein the nozzle includes a nozzle body that is shaped into a triangular pyramid bar having a vertex line at which a plurality of nozzle holes is arranged and having a side surface at a slant with respect to the bottom surface of the body, a plurality of flow controllers being arranged under the plurality of the nozzle holes, respectively, and controlling an injection speed of the injection chemicals.

3. The chemical supply structure as claimed in claim 2, wherein the flow controller includes a flow control ball having a substantially same diameter as the respective nozzle hole such that the injection chemicals injected from the injection hole collide with the flow control ball and the kinetic energy of the injection chemicals is reduced.

4. The chemical supply structure as claimed in claim 1, wherein the contact angle of the mixed solution is in a range of 150° to 175° with respect to the bottom surface of the body and the side surface of the nozzle.

5. The chemical supply structure as claimed in claim 4, wherein the hydrophobic unit includes a hydrophobic layer coated on the bottom surface of the body and the side surface of the nozzle.

6. The chemical supply structure as claimed in claim 5, wherein the hydrophobic layer includes one of vanadium oxide layer and a self-assembled monolayer.

7. The chemical supply structure as claimed in claim 4, wherein the hydrophobic unit includes a hydrophobic pattern on the bottom surface of the body and the side surface of the nozzle.

8. The chemical supply structure as claimed in claim 7, wherein the hydrophobic pattern includes an insulation pattern having a width and a gap in a range of 10 nm to 30 nm.

9. The chemical supply structure as claimed in claim 8, wherein the insulation pattern has a height that is 3 times to 5 times the width.

10. The chemical supply structure as claimed in claim 4, wherein the hydrophobic unit includes a plurality of protrusions on the bottom surface of the body and the side surface of the nozzle.

11. The chemical supply structure as claimed in claim 1, wherein the substrate includes a photoresist layer and the injection chemicals include a developing solution for dissolving the photoresist layer such that the mixed solution includes photoresist materials dissolved into the developing solution.

12. A developing apparatus for a substrate having an exposed photoresist layer thereon, the exposed photoresist layer being partially exposed to light according to a reticle pattern, the developing apparatus comprising:
a spin chuck structure that rotates with respect to a rotating axis of the substrate;
a first chemical supply structure that supplies one of rinse solution and a pre wetting solution onto the substrate; and
a second chemical supply structure that supplies a developing solution onto the substrate such that the photoresist layer is partially dissolved into the developing solution, thereby forming a mixed solution in which photoresist materials are dissolved in the developing solution;
wherein the second chemical supply structure includes:
a body having a bar-shape, the body partially crossing the substrate and having a plurality of chemical reservoirs in which a plurality of chemicals is individually stored, a plurality of the chemicals being mixed to form the developing solution;
a nozzle having a bar-shape, the nozzle protruding from a bottom surface of the body and injecting the developing solution onto the substrate; and
a hydrophobic unit arranged on the bottom surface of the body and on a side surface of the nozzle such that the mixed solution is prevented from adhering to the bottom surface of the body and the side surface of the nozzle by controlling a contact angle of the mixed solution with respect to the bottom surface of the body and the side surface of the nozzle.

13. The chemical supply structure as claimed in claim 12, wherein the nozzle includes a nozzle body that is shaped into a triangular pyramid bar having a vertex line at which a plurality of nozzle holes is arranged and having a side surface at a slant with respect to the bottom surface of the body, a plurality of flow controllers being arranged under the plurality of the nozzle holes, respectively, and controlling an injection speed of the injection chemicals.

14. The developing apparatus as claimed in claim 13, wherein the contact angle of the mixed solution is in a range of 150° to 175° with respect to the bottom surface of the body and the side surface of the nozzle.

15. The developing apparatus as claimed in claim 14, wherein the hydrophobic unit includes a hydrophobic layer coated on the bottom surface of the body and the side surface of the nozzle.

16. The developing apparatus as claimed in claim 15, wherein the hydrophobic layer includes one of vanadium oxide layer and a self-assembled monolayer.

17. The developing apparatus as claimed in claim 14, wherein the hydrophobic unit includes a hydrophobic pattern on the bottom surface of the body and the side surface of the nozzle.

18. The developing apparatus as claimed in claim 17, wherein the hydrophobic pattern includes an insulation pattern having a width and a gap in a range of 10 nm to 30 nm.

19. The chemical supply structure as claimed in claim 14, wherein the hydrophobic unit includes a plurality of protrusions on the bottom surface of the body and the side surface of the nozzle.

20. The chemical supply structure as claimed in claim 12, wherein the first chemical supply structure includes a wetting nozzle for supplying the pre wetting solution to the substrate prior to the injection of the developing solution and a rinsing nozzle for rinsing away the photoresist materials dissolved out from the photoresist layer by the developing solution.

* * * * *